(12) United States Patent
Ning (10) Patent No.: US 11,205,499 B2
(45) Date of Patent: Dec. 21, 2021

(54) MEMORY CIRCUIT DEVICE AND A METHOD FOR TESTING THE SAME

(71) Applicant: Changxin Memory Technologies, Inc., Anhui (CN)

(72) Inventor: Shu-Liang Ning, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/085,051

(22) Filed: Oct. 30, 2020

(65) Prior Publication Data

US 2021/0050069 A1 Feb. 18, 2021

Related U.S. Application Data

(63) Continuation of application No. PCT/CN2019/085292, filed on Apr. 30, 2019.

(30) Foreign Application Priority Data

May 3, 2018 (CN) .......................... 201810416428.2

(51) Int. Cl.
*G11C 29/00* (2006.01)
*G11C 29/44* (2006.01)
(Continued)

(52) U.S. Cl.
CPC .............. *G11C 29/44* (2013.01); *G11C 29/10* (2013.01); *G11C 29/18* (2013.01); *G11C 29/36* (2013.01); *G11C 29/785* (2013.01)

(58) Field of Classification Search
CPC ......... G11C 29/44; G11C 29/10; G11C 29/18; G11C 29/36; G11C 29/785; G11C 29/702
See application file for complete search history.

(56) References Cited

U.S. PATENT DOCUMENTS 6,205,065 B1   3/2001   Sugibayashi
6,243,307 B1   6/2001   Kawagoe
(Continued)

FOREIGN PATENT DOCUMENTS

CN   1264127 A   8/2000
CN   1278647 A   1/2001
(Continued)

OTHER PUBLICATIONS

PCT International Search Report and the Written Opinion dated Jul. 5, 2019, issued in related International Application No. PCT/CN2019/085292 (8 pages).

*Primary Examiner* — Mohammed A Bashar
(74) *Attorney, Agent, or Firm* — Sheppard Mullin Richter & Hampton LLP (57) ABSTRACT

A memory circuit device and a memory test method are disclosed. The memory circuit device includes: a memory cell array, including storage lines and redundant storage lines; and a redundant decoder control circuit, configured to receive an address of a failed storage line from a testing device and activate a corresponding redundant storage line based on the address of the failed storage line, so that the redundant storage line can replace and store data in the failed storage line, wherein the address of the failed storage line is determined while testing operation status of the storage lines in the memory cell array. Embodiments of the present invention can improve repair efficiency of the memory circuit device through activating the associated redundant storage line by the redundant decoder control circuit based on the address of the failed storage line rather than under the control of an external controller.

8 Claims, 6 Drawing Sheets

(51) Int. Cl.
*G11C 29/10* (2006.01)
*G11C 29/18* (2006.01)
*G11C 29/36* (2006.01)

(56) References Cited

U.S. PATENT DOCUMENTS

| | | | | |
|---|---|---|---|---|
| 6,259,639 | B1* | 7/2001 | Hashizume | G11C 29/44 |
| | | | | 365/189.05 |
| 2003/0123301 | A1* | 7/2003 | Jang | G11C 29/785 |
| | | | | 365/200 |
| 2004/0221210 | A1* | 11/2004 | Hoffmann | G11C 29/24 |
| | | | | 714/719 |
| 2012/0257462 | A1* | 10/2012 | Cho | G11C 29/785 |
| | | | | 365/189.07 |

FOREIGN PATENT DOCUMENTS

| | | |
|---|---|---|
| CN | 108447520 A | 8/2018 |
| CN | 208240359 U | 12/2018 |

* cited by examiner

MEMORY CIRCUIT DEVICE AND A METHOD FOR TESTING THE SAME

CROSS-REFERENCE TO RELATED APPLICATIONS

This application is a continuation application of International Patent Application No. PCT/CN2019/085292, filed on Apr. 30, 2019, which is based on and claims priority of Chinese Patent Application No. 201810416428.2, filed with the State Intellectual Property Office (SIPO) of the People's Republic of China on May 3, 2018. The above-referenced applications are incorporated herein by reference in their entirety.

TECHNICAL FIELD

The present invention relates to the field of memory devices and, in particular, a memory circuit device and a method for testing the memory circuit device.

BACKGROUND

As circuit complexity increases, it is inevitable to have defective or failed memory cells in various types of memory devices during fabrication. For this reason, a memory cell array may be provided with a testing device capable of identifying defective or failed cells in the array. When defective or failed devices are identified, redundant devices may be used to replace the failed devices.

Figure 1:
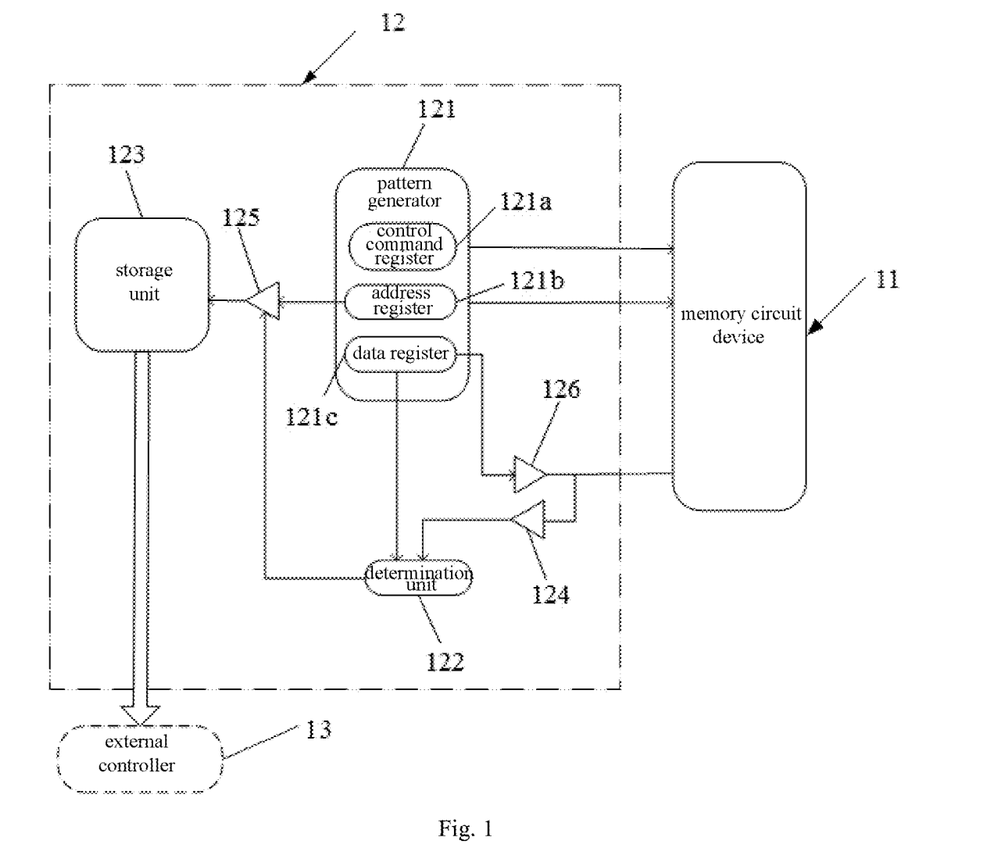
FIG. 1 is a schematic of a conventional memory circuit device and a testing device connected thereto.

FIG. 1 is a schematic of connection of a conventional memory circuit device 11 and an associated testing device 12. The memory circuit device 11 comprises memory cell array. The testing device 12 is configured to test whether there is any failed storage line in the memory circuit device 11. This testing process may comprise: the testing device 12 receiving a test command for testing the memory circuit device 11 and storing the command on a control command register 121a in a pattern generator 121. The test command contains storage address information of the memory cell array to be tested and correct data to be stored at the storage address. The storage address to be tested is stored in an address register 121b, and the correct data to be stored at the storage address are stored in a data register 121c. A determination unit 122 receives, from the memory cell array, actually stored data that are actually stored at the storage address and are amplified by an operational amplifier 124, and compares the actually stored data with the correct data in the data register 121c. If an output from the determination unit 122 indicates that the two data match, it is determined that a storage line associated with the storage address has not failed. Otherwise, if the output indicates that the two data do not match, it is determined that the storage line associated with the storage address is a failed storage line. The comparison results are amplified by another operational amplifier 125, and the amplified comparison results are output by the operational amplifier 125 to a storage unit 123. At the same time, the storage address is amplified by another operational amplifier 126, and the amplified storage address is also sent to the storage unit 123 by the address register 121b. The storage unit 123 then notifies an external controller 13 of the failed storage line associated with the storage address, and the external controller 13 then designates a redundant storage line to replace the failed storage line. Subsequently, according to a control command from the external controller 13, the address register 121b output the address of the failed storage line to the memory cell array, such that the failed storage line can be replaced by the redundant storage line with respect to the address of the failed storage line. The data corresponding to the failed storage line of the data register 121c are amplified by the operational amplifier 126 and sent to the designated redundant storage line.

In this method, however, information regarding the failed storage line needs to be stored in a storage unit before it can be analyzed by the external controller. The external controller then sends control command generated based on the analysis to the memory cell array. This increases data operations and transmissions, thereby lowering repair efficiency of the memory circuit device.

SUMMARY

The present invention proposes a memory circuit device and a memory test method which can provide a beneficial option for solving one or more of the problems described in the background section.

In a first aspect, embodiments of the present invention provide a memory circuit device including:

a memory cell array comprising at least one storage line and at least one redundant storage line for storing data; and a redundant decoder control circuit configured to receive an address of a failed storage line from a testing device and activate a corresponding redundant storage line based on the address of the failed storage line, wherein the corresponding redundant storage line replaces the failed storage line and stores data, wherein the address of the failed storage line is determined by the testing device while testing operation status of the at least one storage line of the memory cell array.

In combination with the first aspect, in a first embodiment of the first aspect of the present invention, the redundant decoder control circuit includes:

at least one redundant storage line control unit, each of the at least one redundant storage line control unit connected to a corresponding redundant storage line.

In combination with the first embodiment of the first aspect, in a second embodiment of the first aspect of the present invention, the redundant storage line control unit includes:

a register unit for receiving the address of the failed storage line from the testing device and storing the address of the failed storage line;

an enabling unit for providing, based on an activation signal, an enable signal to a compare unit, wherein the compare unit is configured to perform a comparison based on the enable signal and simultaneously provide a "used" signal to a next redundant storage line control unit to activate the next redundant storage line control unit; and the compare unit for receiving, from the testing device, an address of a to-be-repaired failed storage line, comparing the address of the to-be-repaired failed storage line with the address of the failed storage line stored in the register unit, and, if the address of the to-be-repaired failed storage line and the address of the failed storage line stored in the register unit match, transmitting an activation signal to the corresponding redundant storage line.

In combination with the second embodiment of the first aspect, in a third embodiment of the first aspect of the present invention, the register unit includes:

a first register logic AND circuit having a first input for receiving the enable signal and a second input for receiving a latch signal;

a register selector having a first input for receiving an address signal and a second input coupled to an output of the first register logic AND circuit;

a first register inverter having an input coupled to an output of the register selector;

a first register FET having a gate coupled to an output of the first register inverter, the first register FET having a source for receiving a high-level signal, the first register FET having a drain coupled to a drain of a second register FET, and the second register FET having a gate coupled to the output of the first register inverter, the second register FET having a source connected to ground, the drain of the second register FET coupled to a first input of a second register logic AND circuit;

the second register logic AND circuit having a second input for receiving a reset signal and an output coupled to a third input of the register selector; and a second register inverter and a third register inverter connected in series, the second register inverter having an input coupled to the output of the second register logic AND circuit, the third register inverter having an output serving as an output of the register unit, wherein the first register FET comprises a P-type FET, and the second register FET comprises an N-type FET.

In combination with the second embodiment of the first aspect, in a fourth embodiment of the first aspect of the present invention, the enabling unit includes:

a first enabling selector having a first input for receiving a latch signal, a second input for receiving the enable signal, and an output coupled to an input of a first enabling inverter;

the first enabling inverter having an output coupled to a gate of a first enabling FET and a gate of a second enabling FET;

the first enabling FET having a source for receiving a high-level signal, the first enabling FET having a drain coupled to a drain of the second enabling FET, the second enabling FET having a source connected to ground;

an enabling logic AND circuit having a first input coupled to the drain of the first enabling FET, a second input for receiving a reset signal, and an output coupled to a third input of the first enabling selector;

a second enabling selector having a first input coupled to the output of the enabling logic AND circuit, a second input for receiving the "used" signal, and an output coupled to an input of a second enabling inverter; and the second enabling inverter connected to a third enabling inverter in series, the third enabling inverter having an output for outputting the "used" signal, wherein the first enabling FET comprises a P-type FET, and the second enabling FET comprises an N-type FET.

In combination with the second embodiment of the first aspect, in a fifth embodiment of the first aspect of the present invention, the compare unit includes:

at least one XOR logic circuit for receiving an address signal and a register signal, and performing an XOR logic operation on the received address and the register signal;

a comparison logic AND circuit having a first input for receiving an enable signal, and a second input for receiving an output signal from the at least one XOR logic circuit; and a first processing inverter and a second processing inverter connected in series, the first processing inverter having an input coupled to an output of the comparison logic AND circuit, the second processing inverter having an output for outputting a match signal, wherein the at least one XOR logic circuit comprises a plurality of XOR logic circuits where there are a plurality of redundant storage line.

In combination with the first aspect, in a sixth embodiment of the first aspect of the present invention, the testing device includes:

a pattern generator configured to store command data for testing the memory cell array;

a determination unit configured to read data from an address under test in the memory cell array based on a test command, compare the read data with correct data to be stored at the address under test, and, if the read data does not match the correct data to be stored, determine that the storage line corresponding to the address under test is failed;

a storage unit for storing the correct data to be stored at the address under test, and, if the storage line corresponding to the address under test is determined as failed, storing the address under test; and a multiplexer for receiving the address under test in the memory cell array and sending the address under test to the storage unit, or receiving the address of the failed storage line and sending the address of the failed storage line to the redundant decoder control circuit.

In combination with the sixth embodiment of the first aspect, in a seventh embodiment of the first aspect of the present invention, the pattern generator includes:

a control command register for storing the test command, wherein the test command controls the address under test in the memory cell array;

an address register for storing the address under test; and a data register for storing the data read from the address under test.

In a second aspect, embodiments of the present invention provide a memory test method using the memory circuit device as defined above. The method includes:

receiving a test command for testing the memory cell array;

acquiring, based on the test command, an address under test in the memory cell array and a corresponding data actually stored at the address under test;

comparing the actually stored data with a correct data to be stored; and if the actually stored data does not match the correct data to be stored, sending an address of a failed storage line corresponding to the address under test to a redundant decoder control circuit, and activating, by the redundant decoder control circuit, a corresponding redundant storage line for replacing the failed storage line.

In combination with the second aspect, in a first embodiment of the second aspect of the present invention, the redundant decoder control circuit comprises at least one redundant storage line control unit, each of the at least one redundant storage line control unit connected to one corresponding redundant storage line, and activating the corresponding redundant storage line for replacing the failed storage line comprises:

storing a first failed storage line address corresponding to the failed storage line;

receiving a second failed storage line address from a data bus;

comparing the first failed storage line address with the second failed storage line address; and if the first failed storage line address matches the second failed storage line address, storing the correct data to be stored at the first failed storage line address on the corresponding redundant storage line.

The technical solution presented in the present invention offers the following advantages: it includes the memory cell array and the testing device, wherein the memory cell array further includes the storage lines, the redundant storage lines, and the redundant decoder control circuit coupled to the redundant storage lines. The redundant decoder control circuit can activate one of the redundant storage lines based on an address of a failed storage line received from the testing device. There is no need to active the redundant storage line by an external controller. This reduces the load of data transmission required for repair of the memory circuit and improves repair efficiency thereof.

The preceding summary is for the purpose of illustration only and is not intended to limit in any way. Besides the above illustrative aspects, embodiments, and features, further aspects, embodiments, and features will be easily understood through the following detailed description and the accompanying drawings.

BRIEF DESCRIPTION OF THE DRAWINGS

Throughout the following drawings, unless otherwise specified, same reference numerals indicate the same or analogous components or elements. The drawings are not necessarily drawn to scale. It is to be understood that these drawings illustrate only some embodiments of the present invention and should not be considered as the limitation of the scope of the present invention.

LIST OF REFERENCE NUMERALS IN DRAWINGS

11—Conventional Memory Circuit Device
12—Testing device
121—Pattern Generator
121a—Control command register
121b—Address register
121c—Data register
122—Determination Unit
123—Storage Unit
124, 125, 126—Operational Amplifiers
13—External Controller
20—Memory Circuit Device
21—Memory Cell Array
211—Storage line
212—Redundant storage line
213—Failed Storage line
22—Redundant decoder control circuit
220—Redundant storage line Control unit
221—register unit
222—Enabling unit
223—Compare unit
30—Testing device
31—Pattern Generator
311—Control command register
312—Address register
313—Data register
32—Determination Unit
33—Storage Unit
34—Multiplexer
35, 36, 37—Operational Amplifiers
A1—First register logic AND Circuit; A11, A12—First and Second Inputs of First register logic AND Circuit; A13—Output of First register logic AND Circuit
C1—Register selector; C11, C12, C14—First, Second and third Inputs of Register selector; C13—Output of Register selector
T1—First register inverter; T11—Inputs of First register inverter; T12—Output of First Register Inverter
Q1—First Register FET; Q11—Gate; Q12—Source; Q13—Drain
Q2—Second Register FET; Q21—Gate; Q22—Drain; Q23—Source
A2—Second register logic AND Circuit; A21, A22—First and Second Inputs of Second register logic AND Circuit; A23—Output of Second register logic AND Circuit
T2—Second Register inverter; T21—Input of Second Register inverter
T3—Third Register inverter; T31—Output of Third Register inverter
C2—First Enabling Selector; C21, C22, C23—First, Second and third Inputs of First Enabling Selector
T4—First Enabling Inverter; T41—Input of First Enabling Inverter; T42—Output of First Enabling Inverter
Q3—First Enabling FET; Q31—Gate; Q32—Source; Q33—Drain
Q4—Second Enabling FET; Q41—Gate; Q42—Drain; Q43—Source
A3—Enabling Logic AND Circuit; A31, A32—First and Second Inputs of Enabling Logic AND Circuit; A33—Output of Enabling Logic AND Circuit
C3—Second Enabling Selector; C31, C32, C34—First, Second and third Inputs of Second Enabling Selector; C33—Output of Second Enabling Selector
T5—Second Enabling Inverter; T51—Input of Second Enabling Inverter
T6—Third Enabling Inverter; T61—Output of Third Enabling Inverter
XOR1—XOR Logic Circuit
A4—Comparison Logic AND Circuit; A41, A42—First and Second Inputs of Comparison Logic AND Circuit; A43—Output of Comparison Logic AND Circuit
T7—First Processing Inverter; T71—Input of First Processing Inverter
T8—Second Processing Inverter; T81—Output of Second Processing Inverter

DETAIL DESCRIPTION OF THE EMBODIMENTS

Described below are certain exemplary embodiments. As will be recognized by those skilled in the art, these embodiments disclosed herein may be modified in various ways without departing from the principle or scope of the present invention. Accordingly, the accompanying drawings and description are exemplary rather than restrictive.

In this specification, the terms "central", "longitudinal", "transverse", "length", "width", "thickness", "up", "down", "front", "rear", "left", "right", "vertical", "horizontal", "top", "bottom", "interior", "exterior", "clockwise", "counterclockwise", "axial", "radial", "circumferential", etc., are used to descript directions and positions with respect to the configurations shown in the figures, merely to facilitate and simplify the explanation of the invention but not to indicate or imply that the described components or elements must have the specific position or operate with a specific structure. Therefore, they do not constitute any restriction to the invention.

In addition, the terms "first", "second", etc., are used herein only for the purpose of illustration, but not for indicating or implying relative importance or indicating the number of the stated features. Therefore, a feature described with "first", "second" or the like can explicitly or implicitly indicate one or more such features. As used herein, the term "plurality" has the meaning of "two or more", unless clearly indicates otherwise.

In this specification, unless defined or limited otherwise, the terms "installed", "attached", "connected", "fixed", etc., should be understand in a broad scope. For example, it can include fixed connection, detachable connection, or integration. It also can include mechanical connection, electrical connection, or communication connection, directly or via an intermediate media. It can also include internal connections or external interaction of two components. For those of ordinary skill in the art, the aforementioned terms can be interpreted based on their context in the specification.

In this specification, unless defined or limited otherwise, when a first feature is described as being "on" or "under" a second feature, it can be in direct contact between the first feature and the second feature, or indirectly contact through a feature of an intervening elements. Moreover, when a first feature is described as being "over", "overlying" or "above" a second feature, it may include right above or obliquely over the second feature, or it may only be located at a horizontal level higher than a horizontal level of the second feature. Similarly, when a first feature is described as being "under", "below" or "beneath" a second feature, it may include right below or obliquely under the second feature, or it may only be located at a horizontal level lower than a horizontal level of the second feature.

The following disclosure provides many different embodiments or examples for implementing different features of the present invention. Components and equipment of specific examples are described below to simplify the present disclosure. They are, of course, merely examples and do not restrict the present invention. In addition, the present disclosure may repeat reference numerals and/or letters in the different examples for simplicity and clarity, and does not indicate a relationship between the various embodiments and/or configurations. Further, although the disclosure provides examples of various particular processes and materials, those of ordinary skill in the art may expand the use of other processes and/or the use of other materials.

Figure 2:
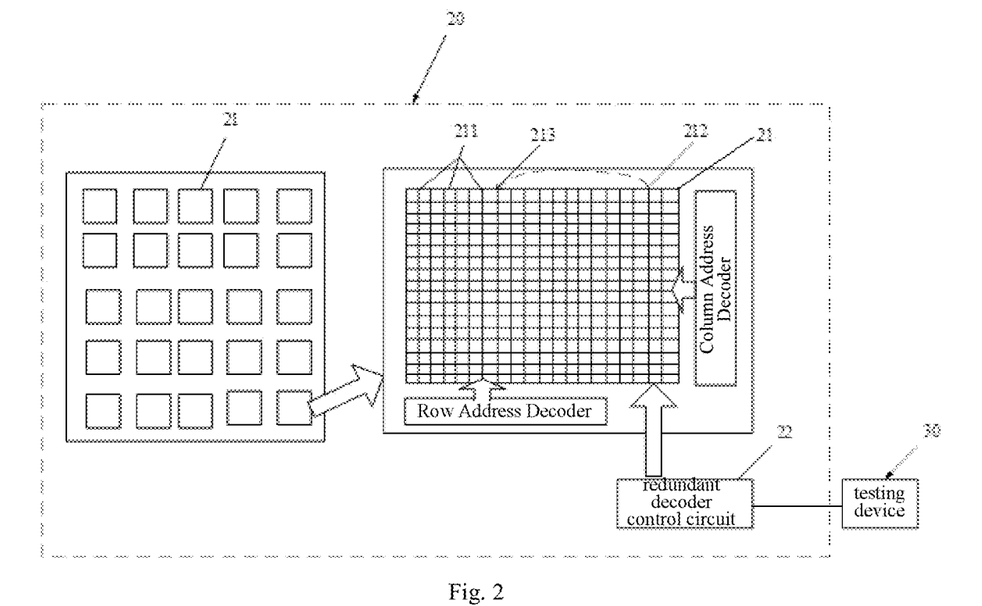
FIG. 2 is a schematic of a memory circuit device and a testing device connected thereto according to a first embodiment of the present invention, and an enlarged schematic of a memory cell array connected to a redundant decoder control circuit in the memory circuit device.

FIG. 2 is a schematic of a memory circuit device 20 according to an embodiment of the present invention. The memory circuit device 20 according to an embodiment of the present invention includes:

a memory cell array 21, including storage lines 211 and redundant storage lines 212 both configured for storing data; and a redundant decoder control circuit 22, configured to receive an address of a failed storage line 213 from a testing device 30 and activate a corresponding redundant storage line 212 based on the address of the failed storage line 213, so that the corresponding redundant storage line 212 replaces the failed storage line 213 and stores data, wherein the address of the failed storage line is determined by the testing device 30 while the testing device 30 tests operation status of the storage lines 211 in the memory cell array 21.

The storage lines 211 according to an embodiment of the present invention include intersecting row storage lines and column storage lines, and storage addresses can be uniquely identified by horizontal and vertical coordinates of intersections of the row storage lines and column storage lines. The redundant storage lines 212 in the memory cell array 21 are not in use prior to activation. When any of the storage lines is failed, one of the redundant storage lines may be activated to store data in place of the failed storage line 213.

Further, the redundant decoder control circuit 22 may include:

at least one redundant storage line control unit, each of the at least one redundant storage line control unit 220 is connected to a corresponding redundant storage line.

Figure 3:
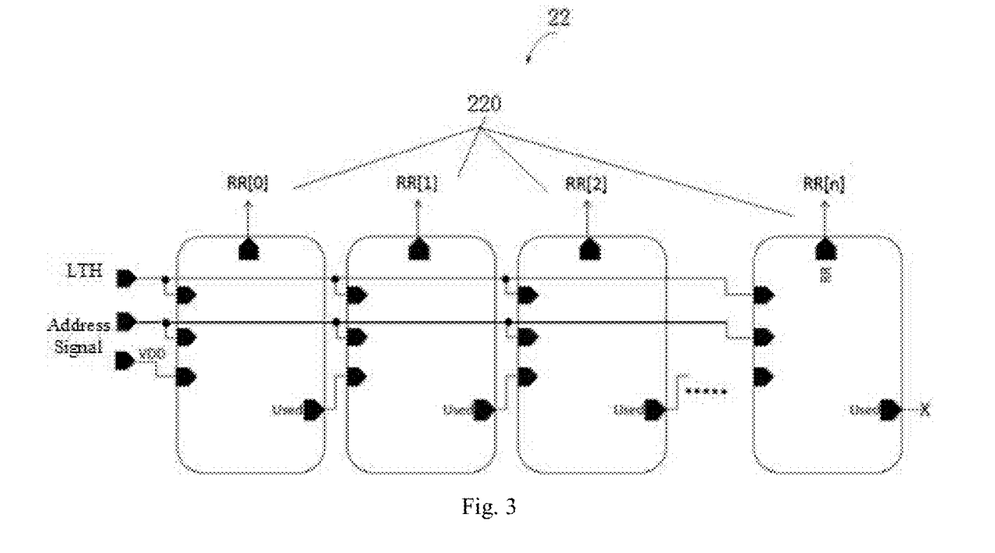
FIG. 3 is a schematic of the redundant decoder control circuit according to the first embodiment of the present invention.

As shown in FIG. 3, since there may be multiple failed storage lines 213, the memory circuit device according to an embodiment of the present invention may include a plurality of redundant storage line control units 220 (RR[0], RR[1], RR[2], . . . , RR[n] in the FIG. 3 denote pins for providing the redundant storage lines with activation signals,) where n is a positive integer, wherein the plurality of redundant storage line control units are connected to a common bus. According to the number of the failed storage lines 213, the redundant storage line control units may be activated sequentially. For example, if there are three failed storage lines, three of the redundant storage line control units will be activated sequentially.

The activation process of the redundant storage line control units may include, for example, upon identifying a first failed storage line during a test, the testing device 30 sends an address of the first failed storage line to a first redundant storage line control unit (corresponding to RR[0]), and simultaneously activates the first redundant storage line control unit, such as applying a high-level signal to a pin VDD of the redundant storage line control unit. The high-level signal serves as an activation signal which causes the pin RR[0] of the first redundant storage line control unit to output a high-level signal to a corresponding redundant storage line, and thus activate the corresponding redundant storage line. In response to receiving the address of the first failed storage line, the first redundant storage line control unit stores the address as a mark that the first redundant storage line is going to write/read data in place of the first failed storage line. As another example, if there are two failed storage lines, two redundant storage line control units and corresponding two redundant storage lines will be activated, in which the first one of the two redundant storage line control units and the first one of the two redundant storage lines will be activated in the same way described above. Noticeably, after the first redundant storage line control unit is activated, a "used" signal pin (USED) of the first redundant storage line control unit outputs a high-level signal as an activation signal for the second redundant storage line control unit. The activation signal for the second redundant storage line control unit notifies the second redundant storage line control unit to receive and store an address of the second failed storage line from the bus, marking that the second redundant storage line is going to write/read data in place of the second failed storage line. Similarly, when activated, each of the redundant storage line control units will output such a "used" signal as an activation signal for activating the next redundant storage line control unit. Moreover, in order to avoid confusion, each of the redundant storage line control units corresponds to only one failed storage line. In this way, the redundant storage line control units can be activated sequentially when the testing device 30 receives the addresses of the failed storage lines.

FIGS. 4 to 7 are schematics of logic circuit of the redundant storage line control unit.

Figure 4:
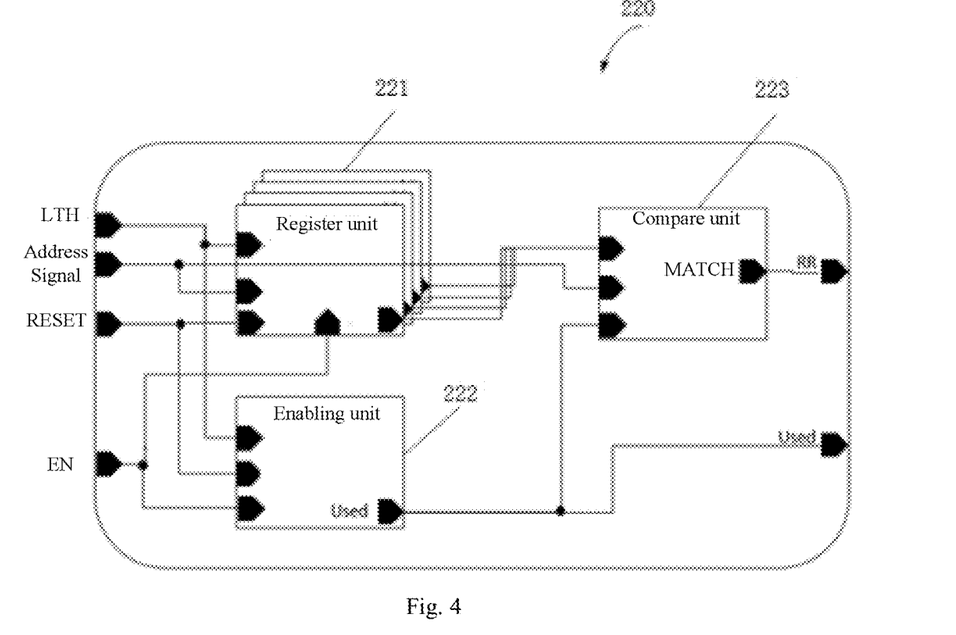
FIG. 4 is a schematic of a redundant storage line control unit according to the first embodiment of the present invention.

As shown in FIG. 4, the redundant storage line control unit 220 may include:

a register unit 221 for receiving the address of the failed storage line from the testing device and storing the address of the failed storage line;

an enabling unit 222 for providing an enable signal to a compare unit based on an activation signal, so that the compare unit performs a signal comparison and simultaneously provides a "used" signal to a next redundant storage line control unit to activate the next redundant storage line control unit; and the compare unit 223 for receiving an address of a to-be-repaired failed storage line from the testing device, comparing the received address of a to-be-repaired failed storage line with the address of the failed storage line stored in the register unit, when the addresses match, transmitting an activation signal to the corresponding redundant storage line.

During reading/writing data, the compare unit 223 compares a storage address associated with the data with the address of the failed storage line stored in the register unit 221. If the addresses match, the data will be read/written. If the addresses do not match, the data bus will pass the data to the next redundant storage line control unit, so that the next redundant storage line control unit can determine whether the data are to be read/written, and so forth.

Figure 5:
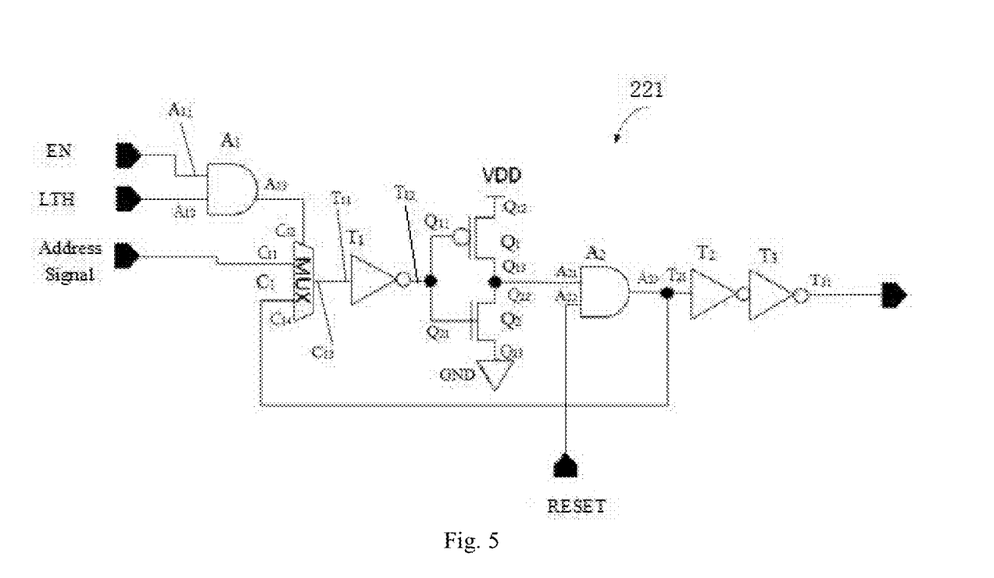
FIG. 5 is a schematic of a register unit according to the first embodiment of the present invention.

As shown in FIG. 5, the register unit 221 may include:

a first register logic AND circuit A1 having a first input A11 for receiving an enable signal, a second input A12 for receiving a latch signal (LTH), and an output A13 coupled to a second input C12 of a register selector C1. The register selector C1 may have a first input C11 for receiving an address signal of a failed storage line. The output C13 of the register selector C1 is coupled to an input T11 of a first register inverter T1. The first register inverter T1 may have an output T12 coupled to a gate Q11 of a first register field effect transistor (FET) Q1. The first register FET Q1 may have a source Q12 for receiving a high-level signal and a drain Q13 coupled to a drain Q22 of a second register FET Q2. The second register FET Q2 may have a source Q23 coupled to ground. The gate Q21 of the second register FET Q2 may be coupled to the output T12 of the first register inverter T1. A drain Q13 of the first register FET Q1 may be further coupled to a first input A21 of a second register logic AND circuit A2. The second register logic AND circuit A2 may have a second input A22 for receiving a reset signal (RESET). The output A23 of the second register logic AND circuit A2 is coupled to a third input C14 of the register selector C1. The output A23 of the second register logic AND circuit A2 may be also coupled to an input T21 of a first register inverter T2. The first register inverter T2 may have an output coupled to an input of a third register inverter T3. The third register inverter T3 may have an output T31 as an output of the register unit. The output T31 can be used to output a register signal. The first register FET Q1 may be a P-type FET and the second register FET Q2 may be a N-type FET.

Figure 6:
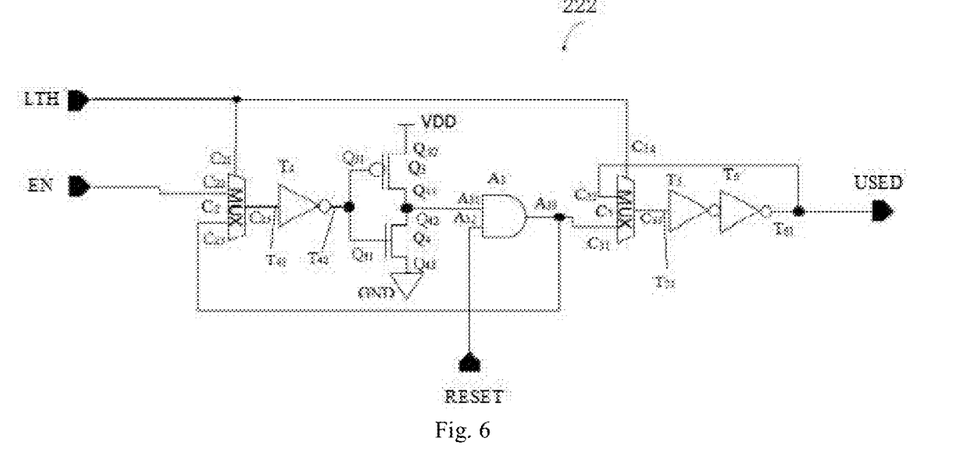
FIG. 6 is a schematic of an enabling unit according to the first embodiment of the present invention.

As shown in FIG. 6, the enabling unit 222 may include:

a first enabling selector C2 having a first input C21 for receiving a latch signal (LTH), a second input C22 for receiving an enable signal (EN) and an output C23 coupled to an input T41 of a first enabling inverter T4. The first enabling inverter T4 may have an output T42 coupled to a gate Q31 of a first enabling FET Q3. The first enabling FET Q3 may have a source Q32 for receiving a high-level signal VDD and a drain Q33 coupled to a drain Q42 of a second enabling FET Q4. The second enabling FET Q4 may have a source Q43 coupled to ground and a gate Q41 coupled to the output T42 of the first enabling inverter T4. The source of the second enabling FET Q4 may be further coupled to a first input A31 of an enabling logic AND circuit A3. The enabling logic AND circuit A3 may have a second input A32 for receiving a reset signal (RESET) and an output A33 coupled to a third input C23 of the first enabling selector C2. A second enabling selector C3 having a third input C34 for receiving the latch signal, a first input C31 coupled to the output A33 of the enabling logic AND circuit A3, and an output C33 coupled to an input of a second enabling inverter T5. The second enabling inverter T5 may have an output coupled to an input of a third enabling inverter T6. The third enabling inverter T6 may have an output T61 coupled to a second input C32 of the second enabling selector C3. The second enabling selector C3 may output a "used" signal (USED). The first enabling FET Q3 may be a P-type FET and the second enabling FET Q4 may be a N-type FET.

Figure 7:
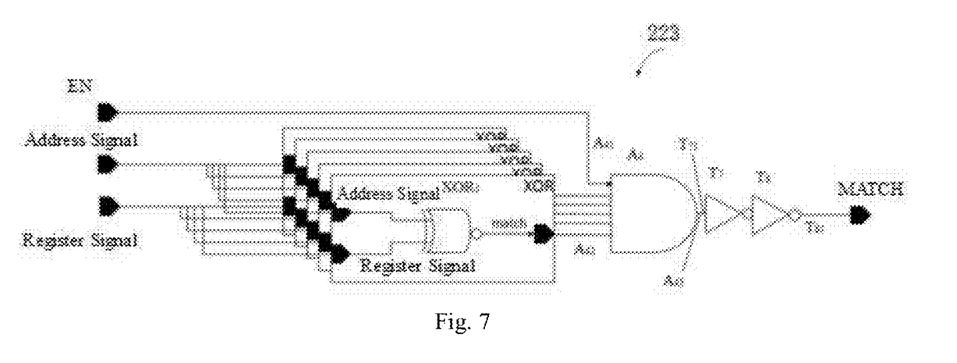
FIG. 7 is a schematic of a compare unit according to the first embodiment of the present invention.

As shown in FIG. 7, the compare unit 223 may include:

at least one XOR logic circuit XOR1, configured to receive an address signal and a register signal and to perform an XOR logic operation on the received address and register signals; a comparison logic AND circuit A4 having a first input A41 for receiving an enable signal (EN), a second input A42 for receiving an output from the at least one XOR logic circuit XOR1, and an output coupled to an input T71 of a first processing inverter T7; the first processing inverter T7, having an output coupled to an input of a second processing inverter T8; and the second processing inverter T8 having an output T81 outputting a match signal (MATCH). In case of multiple redundant address lines, the at least one XOR logic circuit may include multiple XOR logic circuits accordingly, and each XOR logic circuit has an output coupled to the input of the logic AND circuit A4.

Herein, the address signal received by the at least one XOR logic circuit XOR1 may be the address of the failed storage line, and the latch signal indicates an address of a failed storage line replaced by a redundant storage line. After the address of the failed storage line has been through XOR and AND logic operations, it can be determined whether the two addresses are the same. If so, it is known that the currently transmitted data is the address of the failed storage line to be replaced, and the data bus can receive the data and store the data in the redundant storage line.

Further, the redundant storage line control units include row redundant storage line control units and column redundant storage line control units.

In the embodiment of the present invention, the testing device 22 tests the individual address in the memory cell array 21 of memory circuit device 20 during testing. Upon detecting any abnormal address, it is difficult to replace only the single defective storage address. Rather, the more common practice is to replace the entire row storage line or column storage line where the defective storage address is located in.

Figure 8:
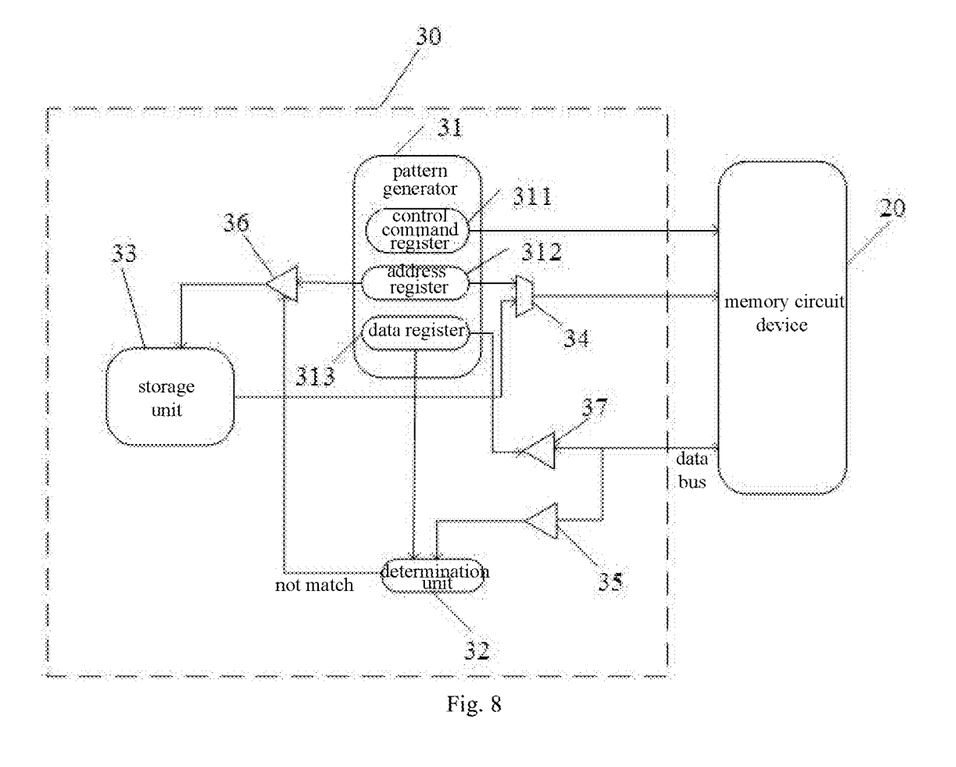
FIG. 8 is another schematic of the memory circuit device and the testing device connected thereto according to the first embodiment of the present invention.

Furthermore, as shown in FIG. 8, the testing device 30 may include:

a pattern generator 31, configured to store command data for testing the memory cell array; and the command data comprise at least one test command, at least one correct data and at least one address under test;

a determination unit 32, configured to read data from an address under test in the memory cell array based on a test command, compare the read data with correct data to be stored at the address under test. When the read data does not match the correct data, it is determined that a storage line corresponding to the address under test is failed;

a storage unit 33 for storing the correct data to be stored at the address under test, and, and when the storage line corresponding to the address under test is determined as failed, storing the address under test; and a multiplexer 34 for receiving the address under test in the memory cell array or sending the address of the failed storage line to the redundant decoder control circuit.

The pattern generator 31 may include:

a control command register 311 for storing the test command, wherein the test command controls the address under test in the memory cell array;

an address register 312 for storing the address under test; and a data register 313 for storing the data read from the address under test.

A process of testing the memory cell array according to an embodiment of the present invention will be described below with respect to FIG. 8.

The memory circuit device according to this embodiment of the present invention includes the memory cell array 21, which can be tested by the associated testing device 30. The testing device 30 is configured to test the memory cell array 21 to determine whether there is any failed storage line in the memory cell array 21 and to repair any found failed storage line. In this testing process, specifically, the pattern generator 31 receives a test command for testing the memory cell array 21, and stores the test command in the control command register 311. The test command includes a storage address under test in the memory cell array 21 and correct data supposedly to be stored at the storage address. The storage address under test may be stored in the address register 312, and the corresponding correct data can be stored in the data register 313. During the test, the pattern generator 31 sends the test command to the memory cell array. Based upon the test command, the actually stored data is amplified by an operational amplifier 35 and sent to the determination unit 32 by the memory cell array 21. Meanwhile, the data register 313 transmits the correct data supposedly to be stored at the storage address to the determination unit 32. The determination unit 32 compares the actually stored data with the correct data supposedly to be stored. If the actually stored data matches the correct data, it is determined that the storage address is not failed and does not need repair, and the test can continue to the next address. Otherwise, if the actually stored data does not match the correct data, it is determined that the storage address is failed. In this case, the comparison result is amplified by another operational amplifier 36 and sent to the storage unit 33. Also, the address stored in the address register is amplified by the operational amplifier 36 and sent to the storage unit 33. If the comparison results in a value of 0, the storage address is marked as an abnormal storage address and a corresponding storage line is a failed storage line.

After that, the storage unit 33 sends the abnormal storage address to the redundant decoder control circuit 22 in the memory cell array, such that the redundant decoder control circuit 22 can repair the failed storage line (herein, the repair may include replacing the failed storage line with one of the redundant storage lines.) An address transmission interface in the memory cell array may transmit a storage address currently under test to the address register 312, or an address to be repaired from the storage unit 33. Thus, one input of a multiplexer 34 may be coupled to the address register 312 and another input of the multiplexer 34 may be coupled to the storage unit 33, to selectively transmit the storage address under test and the storage address to be repaired.

Furthermore, the correct data supposedly to be stored at the storage address are amplified by another operational amplifier 37 and sent by the data register 313 to the redundant storage line corresponding the redundant decoder control circuit 22 in the memory cell array for data writing/reading.

Compared to the prior art shown in FIG. 1, according to this embodiment of the present invention, the failed storage address is sent to the memory cell array 21 via the operational amplifier 37 rather than sending to an external controller. The storage unit 33 of the memory cell array 21 receives and stores the failed storage address. Based on the failed storage address, the redundant storage line control unit 31 activates a corresponding redundant storage line to repair the memory cell array. The circuit eliminates the steps of outputting or receiving repair commands to/from an external controller, thus improving the memory repair efficiency.

According to this embodiment of the present invention, the memory circuit device includes the memory cell array and the testing device. The memory cell array further includes the storage lines, the redundant storage lines, and the redundant decoder control circuit coupled to the redundant storage lines. The redundant decoder control circuit can activate one of the redundant storage lines based on an address of a failed storage line received from the testing device, rather than under the control of an external controller. This reduces the load of data transmission required for repairing the memory circuit and improves repair efficiency thereof.

Embodiment 2

Figure 9:
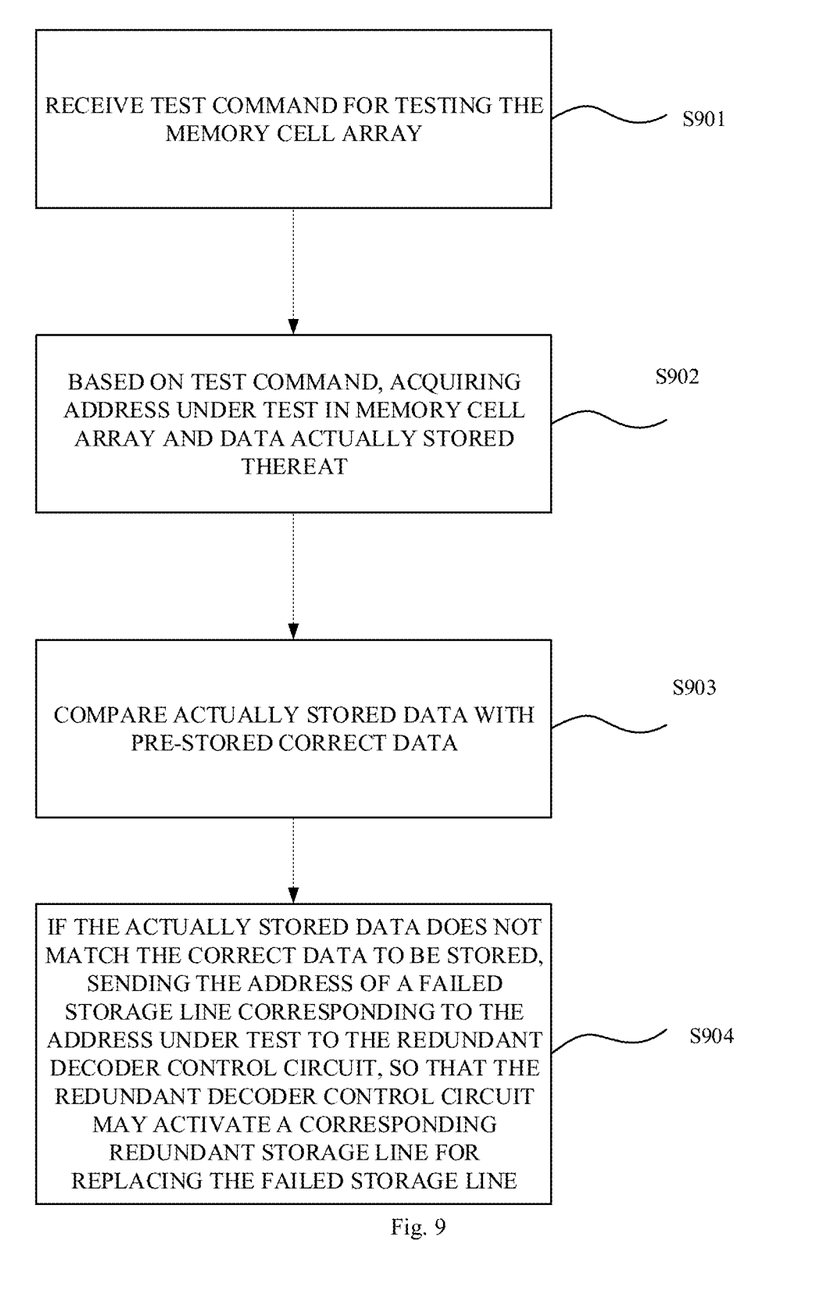
FIG. 9 is a flowchart of a memory test method according to a second embodiment of the present invention.

In a second embodiment of the present invention, a memory test method is provided for testing the memory cell array in the memory circuit device as described above. As shown in FIG. 9, the memory test method according to the embodiment of the present invention includes the steps of:

S901 receiving a test command for testing the memory cell array;

S902 based on the test command, acquiring an address under test in the memory cell array and data actually stored at the address under test;

S903 comparing the actually stored data with correct data to be stored; and

S904 if the actually stored data does not match the correct data to be stored, sending the address of a failed storage line corresponding to the address under test to the redundant decoder control circuit, so that the redundant decoder control circuit may activate a corresponding redundant storage line for replacing the failed storage line.

The redundant decoder control circuit includes at least one redundant storage line control unit, each redundant storage line control unit is connected to a corresponding redundant storage line.

Step S904 may include: A) storing a corresponding first failed storage line address; B) receiving a second failed storage line address from a data bus; C) comparing the first failed storage line address with the second failed storage line address; and D) if the first failed storage line address matches the second failed storage line address, storing the correct data to be stored at the first failed storage line address on the corresponding redundant storage line.

In this method, the data stored at the storage addresses in the memory cell array are under test. If a data at a storage address is found to be incorrect, the storage address is determined to be failed and sent to the repair circuit for repairing the memory circuit device. As such, the testing and the repair of the memory circuit device can be accomplished without involving any external controller, resulting in an improvement in memory repair efficiency.

Described above are a portion of embodiments of the present invention. However, the protection under the scope of the present invention includes, but not limited to, at least these disclosed embodiments. All changes and substitutions deviated by those of ordinary skill in the art in light of teachings and disclosures of the present invention, shall under protection of the scope of the present invention. Accordingly, the scope of protection of the present invention may be defined by the claims.

What is claimed is:

1. A memory circuit device, comprising:
    a memory cell array comprising at least one storage line and at least one redundant storage line for storing data; and
    a redundant decoder control circuit configured to receive an address of a failed storage line from a testing device and activate a corresponding redundant storage line based on the address of the failed storage line, wherein the corresponding redundant storage line replaces the failed storage line and stores data,
    wherein the address of the failed storage line is determined by the testing device while testing operation status of the at least one storage line of the memory cell array, and
    the redundant decoder control circuit comprises: at least one redundant storage line control unit, each of the at least one redundant storage line control unit connected to a corresponding redundant storage line,
    and wherein each of the at least one redundant storage line control unit comprises:
        a register unit for receiving the address of the failed storage line from the testing device and storing the address of the failed storage line;
        an enabling unit for providing, based on an activation signal, an enable signal to a compare unit, wherein the compare unit is configured to perform a comparison based on the enable signal and simultaneously provide a "used" signal to a next redundant storage line control unit to activate the next redundant storage line control unit; and
        the compare unit for receiving, from the testing device, an address of a to-be-repaired failed storage line, comparing the address of the to-be-repaired failed storage line with the address of the failed storage line stored in the register unit, and, if the address of the to-be-repaired failed storage line and the address of the failed storage line stored in the register unit match, transmitting an activation signal to the corresponding redundant storage line,
    wherein the compare unit comprises:
        at least one XOR logic circuit for receiving an address signal and a register signal, and performing an XOR logic operation on the received address and the register signal;
        a comparison logic AND circuit having a first input for receiving an enable signal, and a second input for receiving an output signal from the at least one XOR logic circuit; and
        a first processing inverter and a second processing inverter connected in series, the first processing inverter having an input coupled to an output of the comparison logic AND circuit, the second processing inverter having an output for outputting a match signal, wherein the at least one XOR logic circuit comprises a plurality of XOR logic circuits when there are a plurality of redundant storage lines.

2. The memory circuit device of claim 1, wherein the register unit comprises:
    a first register logic AND circuit having a first input for receiving the enable signal and a second input for receiving a latch signal;
    a register selector having a first input for receiving an address signal and a second input coupled to an output of the first register logic AND circuit;
    a first register inverter having an input coupled to an output of the register selector;
    a first register FET having a gate coupled to an output of the first register inverter, the first register FET having a source for receiving a high-level signal, the first register FET having a drain coupled to a drain of a second register FET, and the second register FET having a gate coupled to the output of the first register inverter, the second register FET having a source connected to ground, the drain of the second register FET coupled to a first input of a second register logic AND circuit;
    the second register logic AND circuit having a second input for receiving a reset signal and an output coupled to a third input of the register selector; and
    a second register inverter and a third register inverter connected in series, the second register inverter having an input coupled to the output of the second register logic AND circuit, the third register inverter having an output serving as an output of the register unit,
    wherein the first register FET comprises a P-type FET, and the second register FET comprises an N-type FET.

3. A memory circuit device, comprising:
    a memory cell array comprising at least one storage line and at least one redundant storage line for storing data; and
    a redundant decoder control circuit configured to receive an address of a failed storage line from a testing device and activate a corresponding redundant storage line based on the address of the failed storage line, wherein the corresponding redundant storage line replaces the failed storage line and stores data,
    wherein the address of the failed storage line is determined by the testing device while testing operation status of the at least one storage line of the memory cell array, and
    the redundant decoder control circuit comprises: at least one redundant storage line control unit, each of the at least one redundant storage line control unit connected to a corresponding redundant storage line, and wherein each of the at least one redundant storage line control unit comprises:
 a register unit for receiving the address of the failed storage line from the testing device and storing the address of the failed storage line;
 an enabling unit for providing, based on an activation signal, an enable signal to a compare unit, wherein the compare unit is configured to perform a comparison based on the enable signal and simultaneously provide a "used" signal to a next redundant storage line control unit to activate the next redundant storage line control unit; and
 the compare unit for receiving, from the testing device, an address of a to-be-repaired failed storage line, comparing the address of the to-be-repaired failed storage line with the address of the failed storage line stored in the register unit, and, if the address of the to-be-repaired failed storage line and the address of the failed storage line stored in the register unit match, transmitting an activation signal to the corresponding redundant storage line,
 wherein the enabling unit comprises:
  a first enabling selector having a first input for receiving a latch signal, a second input for receiving the enable signal, and an output coupled to an input of a first enabling inverter;
  the first enabling inverter having an output coupled to a gate of a first enabling FET and a gate of a second enabling FET;
  the first enabling FET having a source for receiving a high-level signal, the first enabling FET having a drain coupled to a drain of the second enabling FET, the second enabling FET having a source connected to ground;
  an enabling logic AND circuit having a first input coupled to the drain of the first enabling FET, a second input for receiving a reset signal, and an output coupled to a third input of the first enabling selector;
  a second enabling selector having a first input coupled to the output of the enabling logic AND circuit, a second input for receiving the "used" signal, and an output coupled to an input of a second enabling inverter; and
  the second enabling inverter connected to a third enabling inverter in series, the third enabling inverter having an output for outputting the "used" signal,
  wherein the first enabling FET comprises a P-type FET, and the second enabling FET comprises an N-type FET.

4. The memory circuit device of claim 1, wherein the testing device comprises:
 a pattern generator configured to store command data for testing the memory cell array;
 a determination unit configured to read data from an address under test in the memory cell array based on a test command, compare the read data with correct data to be stored at the address under test, and, if the read data does not match the correct data to be stored, determine that the storage line corresponding to the address under test is failed;
 a storage unit for storing the correct data to be stored at the address under test, and, if the storage line corresponding to the address under test is determined as failed, storing the address under test; and
 a multiplexer for receiving the address under test in the memory cell array and sending the address under test to the storage unit, or receiving the address of the failed storage line and sending the address of the failed storage line to the redundant decoder control circuit.

5. The memory circuit device of claim 4, wherein the pattern generator comprises:
 a control command register for storing the test command, wherein the test command controls the address under test in the memory cell array;
 an address register for storing the address under test; and
 a data register for storing the data read from the address under test.

6. A memory test method, comprising:
 receiving a test command for testing the memory cell array;
 acquiring, based on the test command, an address under test in the memory cell array and a corresponding data actually stored at the address under test;
 comparing the actually stored data with a correct data to be stored; and
 if the actually stored data does not match the correct data to be stored, sending an address of a failed storage line corresponding to the address under test to a redundant decoder control circuit, and activating, by the redundant decoder control circuit, a corresponding redundant storage line for replacing the failed storage line,
 wherein the redundant decoder control circuit comprises at least one redundant storage line control unit, each of the at least one redundant storage line control unit connected to one corresponding redundant storage line,
 wherein each of the at least one redundant storage line control unit comprises:
  a register unit;
  an enabling unit coupled to the register unit; and
  a compare unit coupled to the register unit and the enabling unit,
  wherein the enabling unit is configured to provide an enable signal to the compare unit,
 and the compare unit comprises:
  at least one XOR logic circuit for receiving an address signal and a register signal, and performing an XOR logic operation on the received address and the register signal;
  a comparison logic AND circuit having a first input for receiving the enable signal, and a second input for receiving an output signal from the at least one XOR logic circuit; and
  a first processing inverter and a second processing inverter connected in series, the first processing inverter having an input coupled to an output of the comparison logic AND circuit, the second processing inverter having an output for outputting a match signal, wherein the at least one XOR logic circuit comprises a plurality of XOR logic circuits when there are a plurality of redundant storage lines, and
 wherein activating the corresponding redundant storage line for replacing the failed storage line comprises:
  storing, by the register unit, a first failed storage line address corresponding to the failed storage line;
  receiving, by the compare unit, a second failed storage line address from a data bus;
  comparing, by the compare unit, the first failed storage line address with the second failed storage line address; and if the first failed storage line address matches the second failed storage line address, storing the correct data to be stored at the first failed storage line address on the corresponding redundant storage line.

7. The memory test method of claim 6, wherein the register unit comprises:
- a first register logic AND circuit having a first input for receiving the enable signal and a second input for receiving a latch signal;
- a register selector having a first input for receiving an address signal and a second input coupled to an output of the first register logic AND circuit;
- a first register inverter having an input coupled to an output of the register selector;
- a first register FET having a gate coupled to an output of the first register inverter, the first register FET having a source for receiving a high-level signal, the first register FET having a drain coupled to a drain of a second register FET, and the second register FET having a gate coupled to the output of the first register inverter, the second register FET having a source connected to ground, the drain of the second register FET coupled to a first input of a second register logic AND circuit;
- the second register logic AND circuit having a second input for receiving a reset signal and an output coupled to a third input of the register selector; and
- a second register inverter and a third register inverter connected in series, the second register inverter having an input coupled to the output of the second register logic AND circuit, the third register inverter having an output serving as an output of the register unit, wherein the first register FET comprises a P-type FET, and the second register FET comprises an N-type FET.

8. The memory test method of claim 6, wherein the enabling unit comprises:
- a first enabling selector having a first input for receiving a latch signal, a second input for receiving the enable signal, and an output coupled to an input of a first enabling inverter;
- the first enabling inverter having an output coupled to a gate of a first enabling FET and a gate of a second enabling FET;
- the first enabling FET having a source for receiving a high-level signal, the first enabling FET having a drain coupled to a drain of the second enabling FET, the second enabling FET having a source connected to ground;
- an enabling logic AND circuit having a first input coupled to the drain of the first enabling FET, a second input for receiving a reset signal, and an output coupled to a third input of the first enabling selector;
- a second enabling selector having a first input coupled to the output of the enabling logic AND circuit, a second input for receiving the "used" signal, and an output coupled to an input of a second enabling inverter; and
- the second enabling inverter connected to a third enabling inverter in series, the third enabling inverter having an output for outputting the "used" signal, wherein the first enabling FET comprises a P-type FET, and the second enabling FET comprises an N-type FET.

* * * * *